(12) United States Patent
Fritsch et al.

(10) Patent No.: US 9,767,872 B2
(45) Date of Patent: *Sep. 19, 2017

(54) CURRENT-MODE SENSE AMPLIFIER AND REFERENCE CURRENT CIRCUITRY

(71) Applicant: International Business Machines Corporation, Armonk, NY (US)

(72) Inventors: Alexander Fritsch, Esslingen (DE); Gerhard Hellner, Schönaich (DE); Michael Kugel, Boeblingen (DE); Rolf Sautter, Bondorf (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/221,935

(22) Filed: Jul. 28, 2016

(65) Prior Publication Data

US 2016/0336049 A1  Nov. 17, 2016

Related U.S. Application Data

(63) Continuation of application No. 14/840,367, filed on Aug. 31, 2015, now Pat. No. 9,564,188.

(30) Foreign Application Priority Data

Sep. 4, 2014  (GB) .................................. 1415669.9

(51) Int. Cl.
*G11C 5/14* (2006.01)
*G11C 7/14* (2006.01)
*G11C 7/06* (2006.01)

(52) U.S. Cl.
CPC ................ *G11C 7/14* (2013.01); *G11C 5/147* (2013.01); *G11C 7/065* (2013.01)

(58) Field of Classification Search
None
See application file for complete search history.

(56) References Cited

U.S. PATENT DOCUMENTS 3,982,138 A   9/1976 Luisi et al.
6,351,416 B2  2/2002 Fuchigami et al.
(Continued)

OTHER PUBLICATIONS

Ohsawa et al., Generation of Accurate Reference Current for Data Sensing in High-Density Memories by Averaging Multiple Pairs of Dummy Cells, IEEE Journal of Solid-State Circuits, Oct. 2011.

*Primary Examiner* — Harry W Byrne
*Assistant Examiner* — Sultana Begum
(74) *Attorney, Agent, or Firm* — Lieberman & Brandsdorfer, LLC

(57) ABSTRACT

An electronic circuit is provided with a current sense amplifier. The amplifier comprises a reference current input terminal, a sense current input terminal, and a first output terminal. The electronic circuit includes a reference current source. The reference current source includes two reference n-FET stacks connected in series, and the reference current input terminal is coupled to a ground terminal via the two reference n-FET stacks. The electronic circuit includes a plurality of memory cells each coupled in parallel via a respective sense n-FET stack to the sense current input terminal. The amplifier is configured to generate a first logical value at the first output terminal of the amplifier in response to a sense current of the sense current input terminal being lower than a reference current of the reference current input terminal. The amplifier is further configured to generate a second logical value at the first output terminal of the amplifier in response to the sense current being higher than the reference current.

15 Claims, 5 Drawing Sheets

(56) References Cited

U.S. PATENT DOCUMENTS

| | | |
|---|---|---|
| 6,707,717 B2 | 3/2004 | Jun-Lin |
| 6,717,876 B2 | 4/2004 | Vlasenko et al. |
| 7,362,602 B1 | 4/2008 | Meng et al. |
| 7,388,788 B2 | 6/2008 | Honda |
| 7,499,358 B2 | 3/2009 | Bauser |
| 2006/0133171 A1 | 6/2006 | Tonda |
| 2006/0170453 A1 | 8/2006 | Zerbe et al. |
| 2010/0172435 A1 | 7/2010 | Ozgun et al. |
| 2011/0069554 A1 | 3/2011 | Lo Giudice et al. |
| 2014/0241090 A1 | 8/2014 | Chen et al. |
| 2015/0270006 A1 | 9/2015 | Yoo et al. |

| | TRU | CMP | IN | IN_INV | OUT_1 | OUT_2 |
|---|---|---|---|---|---|---|
| PHASE 1 | 1 | | 1 | 0 | 1 | 1 |
| PHASE 2 MISS | 0 | 1 | 0 | 1 | 0 | 1 |
| PHASE 2 MATCH | 0 | 1 | 0 | 1 | 1 | 0 |

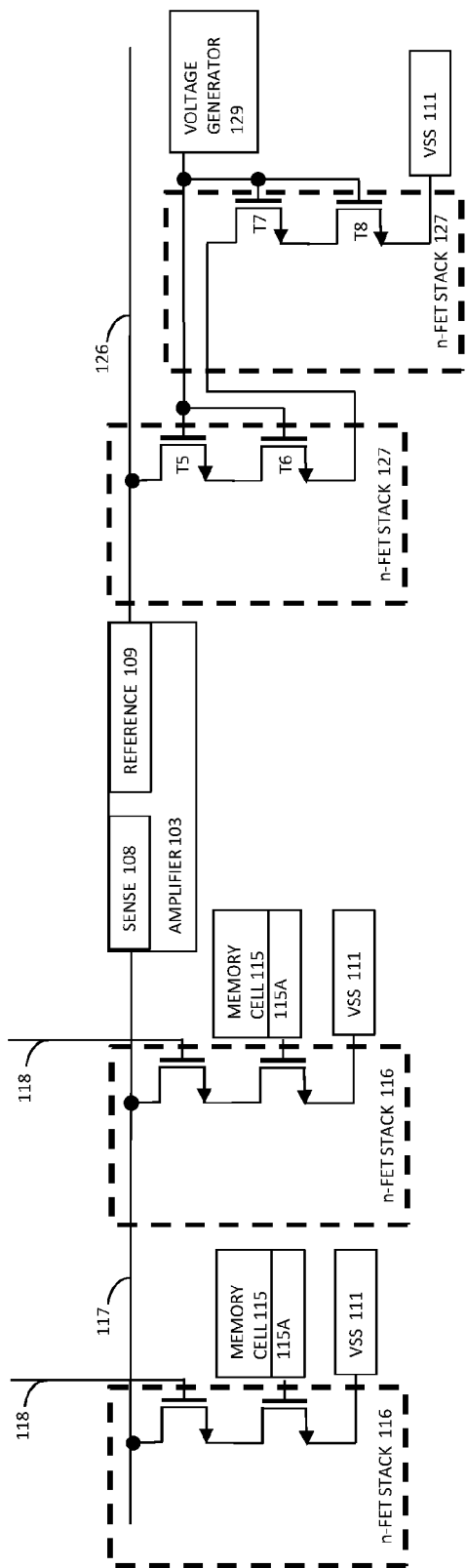
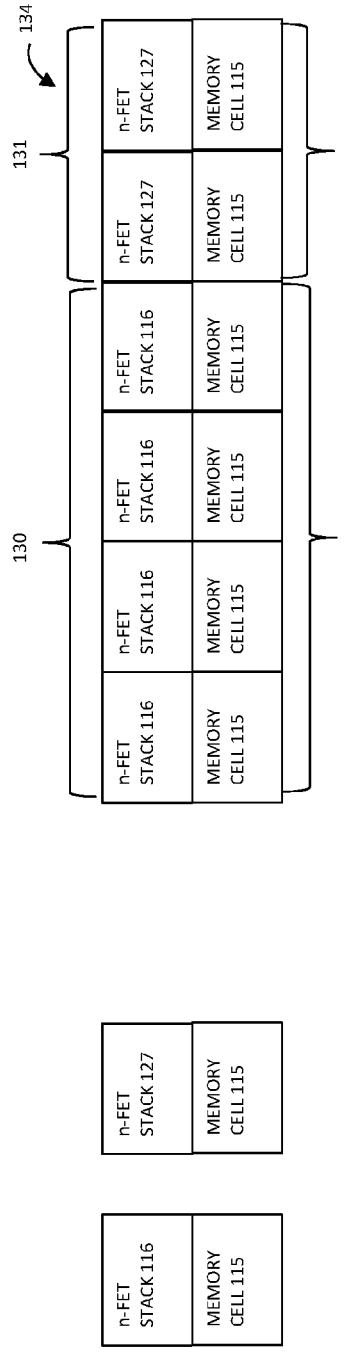
Fig. 4
Fig. 6
Fig. 5

… (US 9,767,872 B2)

CURRENT-MODE SENSE AMPLIFIER AND REFERENCE CURRENT CIRCUITRY

CROSS-REFERENCE TO RELATED APPLICATION(S)

This application is a continuation of application Ser. No. 14/840,367 filed on Aug. 31, 2015, now pending, which claims priority under 35 U.S.C. §119 from United Kingdom Patent Application No. 1415669.9, filed on Sep. 4, 2014, the entire contents of which are incorporated by reference herein.

BACKGROUND

Technical Field

The present embodiments relate to integrated circuits. More specifically, the present embodiments relate to an improved current sense amplifier equipped with an advanced reference current generator.

Description of the Prior Art

Several techniques may be implemented to read data in a memory cell. For instance a current sense amplifier may be used for reading data stored in a memory cell. In this regard, the current sense amplifier may compare cell current to a reference current. The reference current may be a current of a reference memory cell. When the memory cell is coupled to the current sense amplifier via a bit line it causes two different currents flowing in the bit line depending on a logical value ("0" or "1") stored in the memory cell. Based on comparison of the current in the bit line against the reference current, the current sense amplifier determines the logical value stored in the memory cell. The choice of current sense amplifiers for reading data stored in the memory cells is determined by the fact that the bit lines have high capacitance. Thus, evaluation of currents flowing in the bit lines enables faster operation of digital circuitry in comparison with the case when evaluation of voltages is used for reading of data stored in the memory cells.

SUMMARY

The aspects described herein comprise an electronic circuit, a method, and a computer program product for a current sense amplifier in an integrated circuit.

According to one aspect, an electronic circuit is provided. The electric circuit includes a current sense amplifier. The amplifier comprises a reference current input terminal, a sense current input terminal, and a first output terminal. The electronic circuit includes a reference current source. The reference current source includes two reference n-FET stacks connected in series, and the reference current input terminal is coupled to a ground terminal via the two reference n-FET stacks. The electronic circuit includes a plurality of memory cells each coupled in parallel via a respective sense n-FET stack to the sense current input terminal. The amplifier is configured to generate a first logical value at the first output terminal of the amplifier in response to a sense current of the sense current input terminal being lower than a reference current of the reference current input terminal. The amplifier is further configured to generate a second logical value at the first output terminal of the amplifier in response to the sense current being higher than the reference current.

According to another aspect, a method is provided for use in an electronic circuit. The method includes comparing a sense current to a reference current. A first logical value is generated in response to the sense current being lower than the reference current. A second logical value is generated in response to the sense current being higher than the reference current.

According to yet another aspect, a computer program product having computer program code is provided for use in an electronic, the computer program product comprising a computer-readable storage medium having computer readable program code embodied thereon, which when executed causes a computer to implement a method of comparing a sense current of a sense current input terminal to a reference current of a reference current input terminal. A first logical value is generated at a first output terminal of the amplifier in response to the sense current being lower than the reference current, and a second logical value is generated at the first output terminal of the amplifier in response to the sense current being higher than the reference current.

BRIEF DESCRIPTION OF THE SEVERAL VIEWS OF THE DRAWINGS

The drawings reference herein form a part of the specification. Features shown in the drawings are meant as illustrative of only some embodiments, and not of all embodiments unless otherwise explicitly indicated.

FIG. 4 depicts a circuit diagram of an electronic circuit comprising memory cells and a current sense amplifier;

FIG. 5 depicts a layout of pairs of n-FET stacks and memory cells;

FIG. 6 depicts a layout of adjacent memory cells and n-FET stacks;

DETAILED DESCRIPTION

Figure 1:
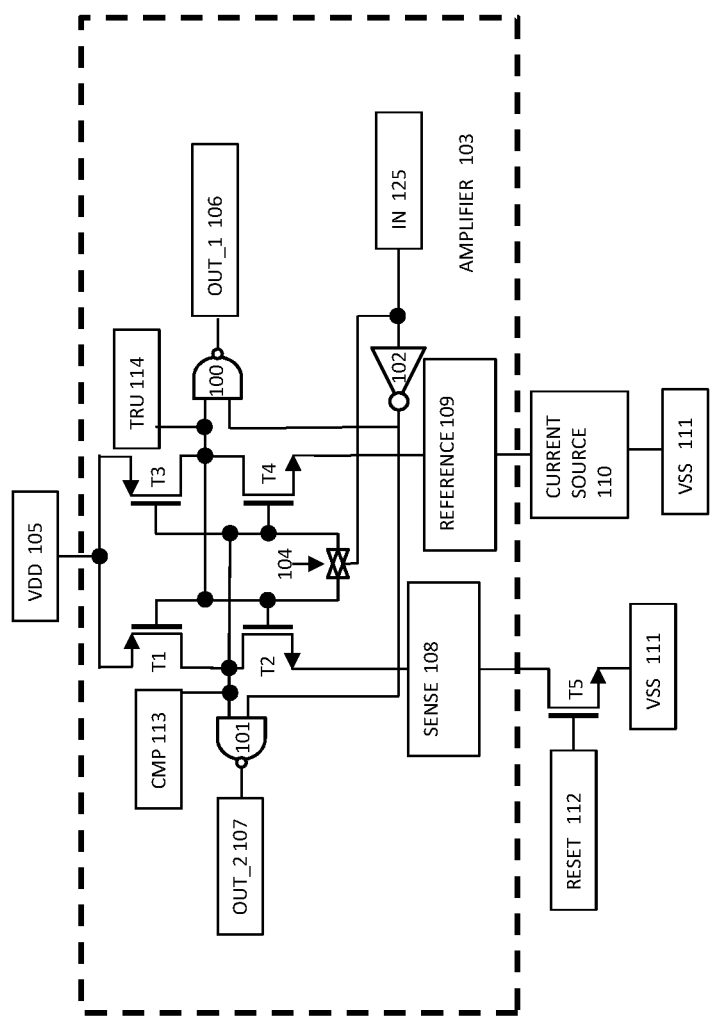
FIG. 1 depicts a circuit diagram of a current sense amplifier.

It will be readily understood that the components, as generally described and depicted in the Figures herein, may be arranged and designed in a wide variety of different configurations. Thus, the following detailed description of the embodiments presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

Furthermore, the described features, structures, or characteristics may be combined in any suitable manner in one or more embodiments. In the following description, numerous specific details are provided, such as examples of sensors, detectors, etc., to provide a thorough understanding of the embodiments. One skilled in the relevant art will recognize, however, that the embodiments can be practiced without one or more of the specific details, or with other methods, components, materials, etc. In other instances, well-known structures, materials, or operations are not shown or described in detail to avoid obscuring aspects of the embodiments.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

In the following description of the embodiments, reference is made to the accompanying drawings that form a part hereof, and which shows by way of illustration the specific embodiment in which the embodiment may be practiced. It is to be understood that other embodiments may be utilized because structural changes may be made without departing from the scope of the present embodiment(s).

Reduction of power consumption and increase in clock frequency are everlasting objectives of digital circuitry development. Reaching these objectives is entangled with further shrinking of transistor dimensions. Achieving these objectives comprises solving numerous related problems in two different fields: layout optimization and circuitry optimization. The layout optimization relates to development of circuitry layouts which are robust against increase in scattering of transistor properties with decrease in transistor size. The circuitry optimization relates to reduction in peak power consumption and in overall power consumption, reduction of cross-talk between different nodes of circuitry, etc. As it will be clearly seen from the following description of a circuitry comprising a current sense amplifier based on a pair of cross-coupled inverters and a circuitry of a reference current source addresses the aforementioned problems in both fields and has numerous advantageous features. The reference current source is configured to generate different reference currents. The reference current source is made of transistors having the same layout as transistors used in coupling circuits for coupling of memory cells to the amplifier. As a result thereof, the scattering of transistor properties in the coupling circuits and the reference current source is reduced and generating of the reference current within the required window is provided. Configuration of the amplifier, the reference current generator, and the coupling circuits (like, for instance, n-FET stacks) enables current limitation in both cases "match" and "mismatch", i.e. when the reference current is lower than the sense current ("mismatch" case) and when the reference current is higher than the sense current ("match" case). The amplifier is configured in a way that no DC currents (except the leakage currents) are flowing through the amplifier in a steady state. Nodes (input terminals, output terminals) of the amplifier are decoupled from each other and as a result thereof cross-talk between them is reduced. In one embodiment, the reference current generator may be a voltage generator or an equivalent.

In another embodiment the circuit further comprises a voltage generator coupled to gate terminals of transistors of the two reference n-FET stacks.

This feature may enable generation of different reference currents. As a result thereof an optimum reference current may be selected.

In another embodiment each of the static memory cells comprises a data output terminal for outputting data stored in the respective static memory cell, wherein each of the data output terminals is coupled to a gate of one n-FET transistor of the associated n-FET stack.

This feature may enable evaluation of data stored in any memory cell and simultaneous evaluation of data stored in any arbitrary plurality of the memory cells.

In another embodiment the voltage generator is configured to set a current flowing though the further two reference n-FET stacks being bigger than zero and lower than an lowest of grounding currents with respect to the associated n-FET stacks, wherein the grounding current of an individual n-FET stack is given by the current that is flowing through the n-FET stack when all of its transistors are open.

This embodiment may provide for an optimum process parameter space for operation of the amplifier.

In another embodiment the voltage generator is configured to set a current flowing though the further two reference n-FET stacks being bigger than a maximum of a sum of the leakage currents of all first n-FET stacks and lower than a lowest of grounding currents with respect to the first n-FET stacks. The grounding current of an individual first n-FET stack is given by the current that is flowing through the first n-FET stack when all of its transistors are open. A leakage current of an individual first n-FET stack is given by the current that is flowing through the first n-FET stack when at least one of its transistors is closed.

This embodiment may provide for an optimum process parameter space for operation of the amplifier.

In another embodiment the static memory cells are arranged in a regular pattern. A first part of the static memory cells is coupled in parallel each via the respective associated n-FET stack to the sense current input terminal. The reference n-FET stacks are comprised in a set of n-FET stacks. Each n-FET stack of the set of n-FET stacks is associated with a static memory cell of a second part of the static memory cells. A geometric footprint of each of the n-FET stacks and the n-FET stacks of the set of n-FET stacks is adjacent to a geometric footprint of the respective associated static memory cell. The geometric footprints of all static memory cells are the same. The geometric footprints of all n-FET stacks and all n-FET stacks of the set of n-FET stacks are the same. Layouts of transistors of the n-FET stacks and the n-FET stacks of the set of n-FET stacks are the same.

This embodiment may provide for utilization of transistors having similar circuitry of the reference current source and for n-FET stacks. As a result thereof an optimum functional window of the circuit is provided.

In another embodiment each n-FET stacks of the set of n-FET stacks corresponds to one of the two reference n-FET stacks.

In another embodiment the set of N-FET stacks comprises four n-FET stacks each having comprised at least one transistor of the reference n-FET stacks.

In another embodiment the current sense amplifier further comprises a control line input terminal. The amplifier further comprises: a first NAND gate comprising an output terminal being coupled to the output terminal of the amplifier, two cross coupled inverters each comprising a n-FET, a transmission gate comprising two transmission terminals and a gate terminal. The gate terminal is coupled to the control line terminal. Sources of the n-FETs are coupled to the sense current input terminal and the reference current input terminal, respectively. One of the transmission terminals is coupled to an input terminal of one of the inverters and the other transmission terminal is coupled to an input terminal of the other inverter. The input terminals of the first NAND gate are coupled to the control line terminal and one of the input terminals of the inverters, respectively.

The circuit architecture of the amplifier described in the previous embodiment may have the following advantages. The amplifier is configured in a way that no DC currents (except leakage currents) are flowing through the amplifier in a steady state. Nodes (input terminals, output terminals) of the amplifier are decoupled from each other and as a result thereof cross-talk between them is reduced.

In another embodiment each input terminal of one inverter is further coupled to an output terminal of the other inverter for forming the cross coupling.

In another embodiment the gate terminal is configured for on/off switching of a coupling between the transmission terminals of the transmission gate.

In another embodiment the input terminal of the first NAND gate coupled to the control line is coupled to the control line via a further inverter.

In another embodiment the current sense amplifier further comprises a second NAND gate and another output terminal. An output terminal of the second NAND gate is coupled to the other output terminal of the amplifier. One of the input terminals of the second NAND gate is coupled to the control line and the other input terminal of the second NAND gate is coupled to the input terminal of the inverter comprising the n-FET having the source coupled to the reference current input terminal. The input terminal of the first NAND gate is coupled to the input terminal of the inverter comprising the n-FET having the source coupled to the sense current input terminal. The current sense amplifier being further configured to: generate the second logical value at the another output terminal, in response to a reference current of the reference current input being higher than a sense current of the sense current input terminal, and generate the first logical value at the another output terminal, in response to a reference current of the reference current input terminal being lower than a sense current of the sense current input terminal.

In another embodiment the input terminals of the second NAND gate are being coupled to the control line via the further inverter.

In another embodiment the sense current input terminal is coupled to a further n-FET being configured for on/off switching of a coupling of the sense current input terminal to a ground terminal.

This feature may enable more stable operation of the amplifier. The input sense terminal may be coupled to the ground when the cross-coupled inverters are latched. The grounding may enable suppression of parasitic voltage drifts at the sense current input terminal. The grounding may further provide an effective resetting the sense current input terminal to a predefined state in a way that every next operation cycle is not affected by one or more previous operation cycles.

In another embodiment the further n-FET is comprised in a further transmission gate.

Geometrical footprint of a circuitry, as understood here, is an area of compact allocation of all transistors of the circuitry. No other transistors except the transistors of the circuitry are allocated in this area. The geometrical footprint may further comprise a portion of spacing area needed for allocation of other transistors of another circuitry having a different geometrical footprint and being adjacent to the geometrical footprint of the circuitry. Adjacent geometrical footprints, as understood here, are geometrical footprints having one common side.

FIG. 1 depicts a circuit diagram of a current sense amplifier (103). The current sense amplifier comprises a reference current input terminal (109), a control line input terminal (125), a sense current input terminal, (108), an output terminal (106), an output terminal (107), a first NAND gate (100), a second NAND gate (101), an inverter (102), a transmission gate (104), and two cross coupled inverters (T1), (T2); (T3), (T4). One of the cross coupled inverters is based on p-FET (T1) and n-FET (T2). Another one of the cross coupled inverters is based on p-FET (T3) and n-FET (T4). The sources of the n-FETs (T2) and (T4) are coupled to the sense current input terminal (108) and the reference current input terminal (109), respectively.

The transmission gate (104) comprises two transmission terminals and a gate terminal. The gate terminal is coupled to the control line terminal. The gate terminal of the transmission gate is identical to the gate terminal of the n-FET comprised in the transmission gate. The gate terminal of the p-FET comprised in the transmission gate is coupled to the inverted control line terminal (not shown in FIG. 1). In an alternative implementation, the "transmission gate" may only comprise 1 single n-FET or 1 single p-FET coupled the same as in the full transmission gate described above. Alternatively the amplifier may comprise only one of the two aforementioned NAND gates and only one of the output terminals (106) and (107).

One of the transmission terminals is coupled to an input terminal of one of the inverters and the other transmission terminal is coupled to an input terminal of the other inverter, i.e. one of the transmission terminals is coupled to gates of the transistors (T1) and (T2) (input of one of the cross coupled inverters) and drains of transistors (T3) and (T4) (output of another one of the cross coupled inverters), another one of the transmission terminals is coupled to gates of the transistors (T3) and (T4) (input of the one of the cross coupled inverters) and drains of transistors (T1) and (T2) (output of the other cross coupled inverter). Sources of the transistors (T1) and (T3) are coupled to power terminal VDD (105).

One input of the NAND gate (100) is coupled via node TRU (114) to the output of the inverter comprising transistors (T3) and (T4). Another input of the NAND gate (100) is coupled to an output of the inverter (102). One input of the NAND gate (101) is coupled via node CMP (113) to the output of the inverter comprising transistors (T1) and (T2). Another input of the NAND gate (101) is coupled to an output of the inverter (102). An output terminal of the NAND gate is coupled to the output terminal (106). An output terminal of the NAND gate (101) is coupled to the output terminal (107).

An input of the inverter (102) is coupled to the control line input terminal (125). The sense current input terminal (108) may be further coupled to ground terminal VSS (111) via n-FET transistor (T5) or via another transmission gate comprising the transistor (T5).

A drain of the transistor (T5) (one transmission terminal of the another transmission gate) is coupled to the sense current input terminal and a source of the transistor (T5) (another transmission terminal of the another transmission gate) is coupled to the ground terminal VSS (111). A gate of the transistor (T5) (a gate of the another transmission gate) is coupled to a reset input terminal (112).

The reference current input terminal is coupled to ground terminal VSS (111) via a current source (110). One output terminal of the current source (110) is coupled to the reference current input terminal (109) and the other output terminal of the current source is coupled to the ground terminal VSS (111). The sense current input terminal may be used for coupling of memory cells to it. The memory cells may be coupled to the sense input current terminal via respective n-FET stacks each. The current sense amplifier is configured to generate a logical value on the output terminal (106) and the logical value in an inverted form on the output terminal (107) when an electrical current flowing through the reference current input terminal is higher than an electrical current flowing through the sense current input terminal.

The current sense amplifier is further configured to generate the logical value on the output terminal (107) and the logical value in an inverted form on the output terminal (106) when an electrical current flowing through the reference current input terminal is lower than an electrical current flowing through the sense current input terminal.

The current source (110) may be a fixed current source based on a single FET transistor. Alternatively the current source (110) may be a programmable current source. For instance, the programmable current source may be implemented using a current mirror scheme.

Figures 2, 3:
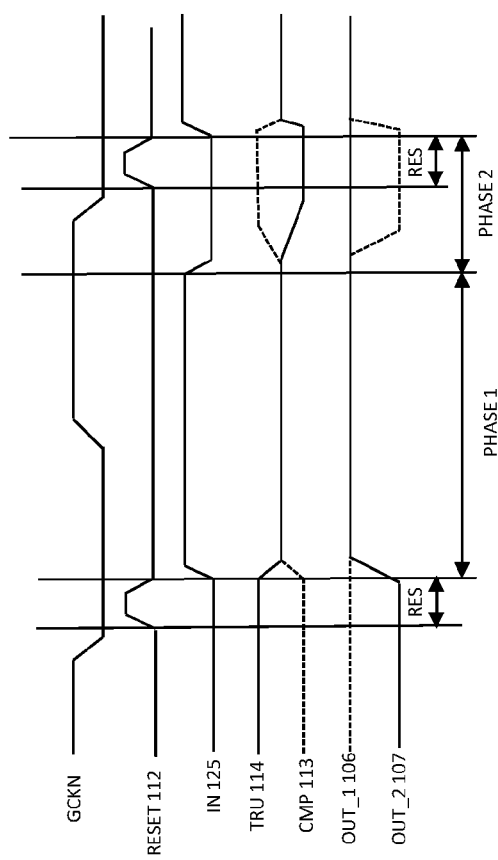
FIG. 2 depicts a timing diagram associated with a current sense amplifier.
FIG. 3 depicts a truth table associated with a current sense amplifier.

The functioning of the amplifier depicted in FIG. 1 is depicted in FIG. 2 and in FIG. 3. FIG. 2 is a timing diagram associated with the amplifier and FIG. 3 depicts a truth table of the amplifier. FIG. 2 depicts time dependencies of voltages at following terminals and nodes being synchronized with a clock signal (GCKN trace in FIG. 2): the reset input terminal (112) (RESET 112 trace in FIG. 2), the control line input terminal (125) (IN (125) trace in FIG. 2), the TRU (114) node (TRU (144) trace in FIG. 2), the CMP node (113) (CMP (113) trace in FIG. 2), the output terminal (106) (OUT_1 (106) trace in FIG. 2), and the output terminal (107) (OUT_2 trace in FIG. 2).

The operation of the amplifier comprises two phases 1 and 2. In phase 1 a voltage at the control line input terminal is high (logical value "1"). This voltage causes the inverter (102) to generate low voltage (logical value "0") at the input terminals of the NAND gates (100) and (101) coupled to the output terminal of the inverter (102). As a result thereof, both of the NAND gates (100) and (101) generate high voltages (logical value "1") at their output terminals. The high voltage at the control line input terminal causes the transmission gate (104) to couple its transmission terminals. As a result thereof, the cross coupled inverters are driven out of a latch state, i.e. voltages at the nodes (113) and (114) are equal and may not correspond to either logical value "0" or logical value "1".

However this uncertainty does not affect performance of digital circuitry coupled to the output terminals (106) and (107) because both of the NAND gates (100) and (101) have on their input terminals coupled to the output terminal of the inverter (102) the low voltage corresponding to a logical value "0" and thus the output terminals of NAND gates (100) and (101) are driven to the high voltage corresponding to a logical "1" independent of the voltage levels of nodes CMP (113) and TRU (114). This case corresponds to a row "PHASE 1" of the truth table in the FIG. 3. The logical values of the TRU and CMP nodes are not filled in in this row because the logical values at these nodes are not defined in the phase 1.

In phase 2 a comparison of a reference current flowing through the reference current input terminal (109) and a sense current flowing through sense current input terminal (108). FIG. 2 depicts a match case when the sense current is current is lower than the reference current. In this case a current flowing through the transistors (T3) and (T4) is higher than a current flowing through the transistors (T2) and (T1), i.e. the node TRU (114) is pulled down stronger than the node CMP (113). As a result thereof the cross coupled transistors are driven into a latched state, wherein a low voltage corresponding to logical value "0" is established on the node TRU (114) and the corresponding input terminal of the NAND gate (100) and a high voltage corresponding to logical value "1" is established on the node CMP (113) and the corresponding input terminal of the NAND gate (101).

In the phase 2 a voltage at the control line input terminal is low (logical value "0"). This voltage causes the inverter (102) to generate high voltage (logical value "1") at the input terminals of the NAND gates (100) and (101) coupled to the output terminal of the inverter (102). These logical values at the input terminals of the NAND gates (100) and (101) cause generation of logical values "1" and "0" at the output terminals of the NAND gates (100),(101) and output terminals (106), (107), respectively. This case is illustrated in a row "PHASE 2 MATCH" of the Table depicted on FIG. 3.

The phase 2 may further comprise a reset pulse causing the transistor (T5) (or the transmission gate comprising the transistor (T5)) to couple the sense current input terminal (108) to the ground terminal VSS 111. The reset pulse is generated in a time interval RES depicted in FIG. 2. This coupling is performed only after the cross coupled inverters are driven into a latched state. In this case the logical values on the output terminals are not disturbed.

A row "PHASE 2 MISS" in the Table depicted in FIG. 3 corresponds to a mismatch case of phase 2 when a reference current flowing through the reference current input terminal (109) is lower than a sense current flowing through sense current input terminal (108). In this case, a current flowing through the transistors (T3) and (T4) is lower than a current flowing through the transistors (T2) and (T1), i.e. the node CMP (113) is pulled down stronger than the node TRU (114). As a result thereof the cross coupled transistors are driven into a latched state, wherein a low voltage corresponding to logical value "0" is established on the node CMP (113) and the corresponding input terminal of the NAND gate (101) and a high voltage corresponding to logical value "1" is established on the node TRU (114) and the corresponding input terminal of the NAND gate (100).

In phase 2, a voltage at the control line input terminal is low (logical value "0"). This voltage causes the inverter (102) to generate high voltage (logical value "1") at the input terminals of the NAND gates (100) and (101) coupled to the output terminal of the inverter (102). These logical values at the input terminals of the NAND gates (100) and (101) cause generation of logical values "0" and "1" at the output terminals of the NAND gates (100),(101) and output terminals (106), (107), respectively.

The amplifier (103) has a number of distinctive advantages. The result of the comparison between the reference current and the sense current is latched, i.e. no specific synchronization is needed for reading data generated by the amplifier. The sense and reference currents are always limited by the electrical resistances of the respective pairs of transistors (T1), (T2) and (T3), (T4) connected in series FIG. 4 depicts an electronic circuitry comprising the amplifier (103). The sense current amplifier (103) depicted on FIG. 4 may be the same as the sense current amplifier (103) depicted in FIG. 1. Alternatively the current sense amplifier (103) depicted on FIG. 4 may be any other current sense amplifier comprising a reference current input terminal (109), a sense current input terminal (108), and an output terminal and being configured to: generate a first logical value at the output terminal, in response to a reference current of the reference current input being higher than a sense current of the sense current input terminal, and generate a second logical value at the output terminal, in response to a reference current of the reference current input terminal being lower than a sense current of the sense current input terminal.

First output terminals (115A) of memory cells (115) are configured to output logical values stored in the memory cells. The memory cells may be static memory cells. The static memory cells may be but are not limited to six transistor memory cells or eight transistor memory cells.

Each of the first output terminals is configured to generate a high voltage corresponding to a logical value "1" when a logical value "1" is stored in the memory cell and to generate a low voltage corresponding to a logical value "0" when a logical value "0" is stored in the memory cell. The first output terminals (115A) are coupled in parallel to the sense current input terminal (108) via a respective first coupling circuitry, each. Each of the first coupling circuitries may be a single n-FET transistor or a first stack of n-FET transistors and configured to couple the sense current input terminal to a ground terminal VSS (111).

For instance the first coupling circuitry may be a single n-FET transistor having a source coupled to the ground terminal VSS (111), a drain coupled to the sense current input terminal, and a gate coupled to the first output terminal (115A) of the respective memory cell (115). The n-FET transistor is configured to transit in an open state, when the high voltage is generated at the first output terminal of the respective memory cell, and transit into a closed state, when the low voltage is generated at the first output terminal of the respective memory cell. The n-FET transistors may be comprised into a respective n-FET first stack (116), each. The n-FET first stacks may comprise additional n-FET transistors coupled in series.

FIG. 4 depicts an example case when each of the n-FET first stacks (116) comprises two n-FET transistors connected in series. A gate of one of transistor of each of the first stacks (116) is coupled the first output terminal (115A) of the respective memory cell (115). A gate of another transistor of each of the first stacks (116) is coupled to a respective word line (118). The word lines (118) may be used for masking the data stored in one or more of the memory cells during evaluation of data stored in the one or more of the memory cells (phase 2).

The configuration of circuitry depicted on FIG. 4 may imply criteria on a choice of a value of the reference current generated by the current generator (110) in the phase 2. The current generator has to generate an electrical current being lower than any of the currents flowing through the sense current input terminal when at least one of the first coupling circuitries couples the sense current input terminal to the ground terminal.

Turning back to example depicted in FIG. 4, the reference current has to be lower than any of currents flowing though one of the n-FET first stacks when all transistors of the n-FET first stack are open. On the other hand the current generator has to generate the reference current higher than a parasitic current flowing through the sense current input terminal when any of the first coupling circuitries do not couple the sense current input terminal to the ground terminal. The parasitic current may be caused by a leakage current of a wiring (117) first coupling the first coupling circuitries to the sense current input terminal (108) and/or by parasitic leakage currents of the first coupling circuits themselves.

The aforementioned interval for an allowable reference current may be further reduced by selecting a sub-interval within it as an interval for the allowable reference current. For instance the sub-interval may be reduced to 50% of the aforementioned interval. It may be a lower, top, or central part of the aforementioned interval.

In order to provide optimum reference current the reference current source may comprise n-FETs connected in series. A number of the n-FETs of the reference current source are twice bigger than a number of transistors in the coupling circuitries. For instance, if the coupling circuitry comprises only one n-FET transistor for coupling of the first output terminal of the respective memory cell to the sense current input terminal of the current sense amplifier, then the reference current source comprises two n-FETs connected in series for coupling of the reference current input terminal to the ground terminal.

Another example is depicted in FIG. 4. The reference current source comprises two n-FET stacks (127) connected in series for coupling of the reference current input terminal (109) to the ground terminal VSS (111), while only one n-FET stack (116) is used for coupling of each of the first output ports (115A) to the sense current input terminal (108). In ideal case, when transistors of the coupling circuits and the reference current source are identical and all other factors are neglected, the sense current is two times higher than the reference current, when the transistors of one of the coupling circuits are open and the transistors of the reference current source are open. As a result thereof the optimum reference current is provided. A number of measures are described further on which may be used for suppression of other factors in order to keep the reference current as close as possible to the optimum reference current.

One of the measures is coupling of the gates of the transistors T5-8 of the reference current source to a voltage generator (129). The current flowing through the reference current source may be tuned by applying a voltage providing the optimum reference current. An example of this solution is depicted on FIG. 4. Gates of transistors (T5-8) of a pair of n-FET stacks (127) are coupled to a voltage generator (129).

Another measure is utilization of the same layouts for n-FET transistors of the coupling circuitry and for n-FET transistors of the reference current generator.

Yet another measure is depicted in FIGS. 5 and 6. Each of the memory cells is associated with the respective coupling circuitry. A geometrical footprint of each of the memory cells is adjacent to a geometrical footprint of the associated coupling circuitry. FIG. 5 depicts an example case, wherein a geometrical footprint of the memory cell (115) is adjacent to a geometrical footprint of the associated n-FET stack (115) and a geometrical footprint of another memory cell (115) is adjacent to a geometrical footprint of the associated n-FET stack (127) comprised in the reference current generator.

The memory cells associated with the coupling circuitries comprising the transistors of the reference current source are dummy memory cells. Their first output terminals are not coupled to any coupling circuits. The dummy memory cells provide for a regular layout enabling suppression of layout related processing effects during manufacturing of transistors causing disparity between transistors. The layout related processing effects may be for instance effects of micro loading during etching processes, wherein the profile of etching depends on a layout of the mask used for etching.

An example regular layout (134) is illustrated on the FIG. 6. The memory cells are split in two sets (132) and (133) and arranged in one row of the memory cells having their geometrical footprints adjacent to each other. The geometrical footprint of each of the memory cells is adjacent to the geometrical footprint of the associated n-FET stack. Each of the memory cells (115) of the second set (133) is associated with the respective n-FET stack (127) of the reference current generator. A geometrical footprint of each of the memory cells of the second set is adjacent to a geometrical footprint of the respective associated n-FET stack (127).

The n-FET stacks (131) are used in circuitry of the reference current source. Each of the memory cells (115) of the first set (132) is associated with the respective n-FET stack (116) being used for the coupling of the each of the memory cells (115) of the first set (132) to the sense current input terminal (108). A geometrical footprint of each of the memory cells of the first set is adjacent to a geometrical footprint of the respective associated n-FET stack (116). The n-FET stacks (130) used for the coupling of the memory cells (130) to the sense current input terminal and the n-FET stacks (131) used for the circuitry of the reference current generator are arranged in one row of the n-FET stacks having their geometrical footprints adjacent to each other.

The n-FET stacks (127) have only minor differences in wiring with respect to the n-FET stacks (116), while layouts of transistors of the of the n-FET stacks (127) and (116) are the same. The memory cells of the first set (132) have only minor differences in wiring with respect to memory cells of the second set, while layouts of transistors of the memory cells of the first and the second set are the same. In the light of the above the layout (134) provides for minimization of a disparity caused by manufacturing process between the transistors of the n-FETS stacks (116) used for coupling of the memory cells to the sense current input terminal (108) and the transistors (T5-8) of a set (131) of the n-FET stacks (127) used in the reference current source.

The pattern/layout of the memory cells and the n-FET stacks depicted in FIG. 6 may be repeated in several rows of a regular array. Each of the rows may comprise one or more patterns. The first set (132) of the memory cells may comprise any arbitrary number of the memory cells. The second set of the dummy memory cells may be equal to or less than a number of transistors connected in series in the reference current source used for coupling of the reference current input terminal to the ground terminal.

Figure 8:
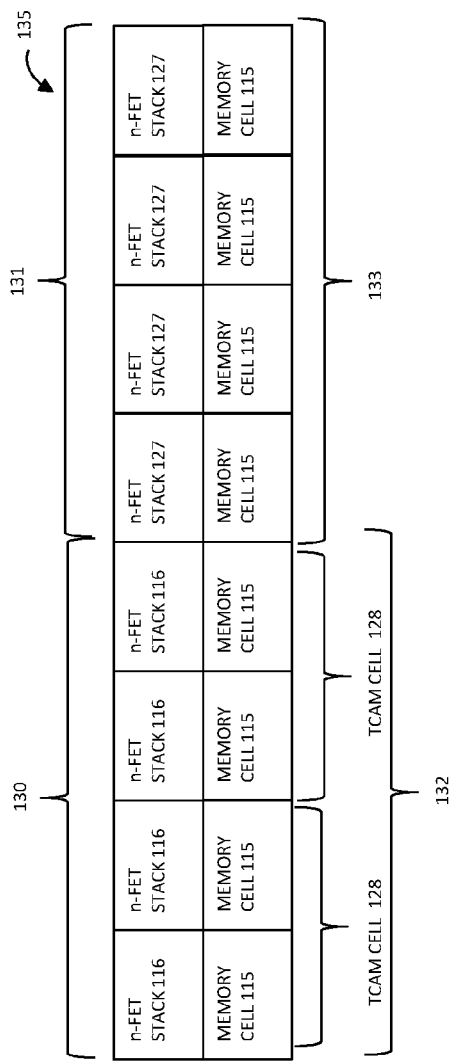
FIG. 8 depicts a layout of adjacent memory cells and n-FET stacks.

The premise for forming of the layout (134) and a further on discussed layout (135) on FIG. 8 is that at least one transistor of each of the coupling circuits associated with dummy cells is used in a series chain of transistors used in the reference current source for coupling of the reference input terminal to the ground terminal.

Figure 7:
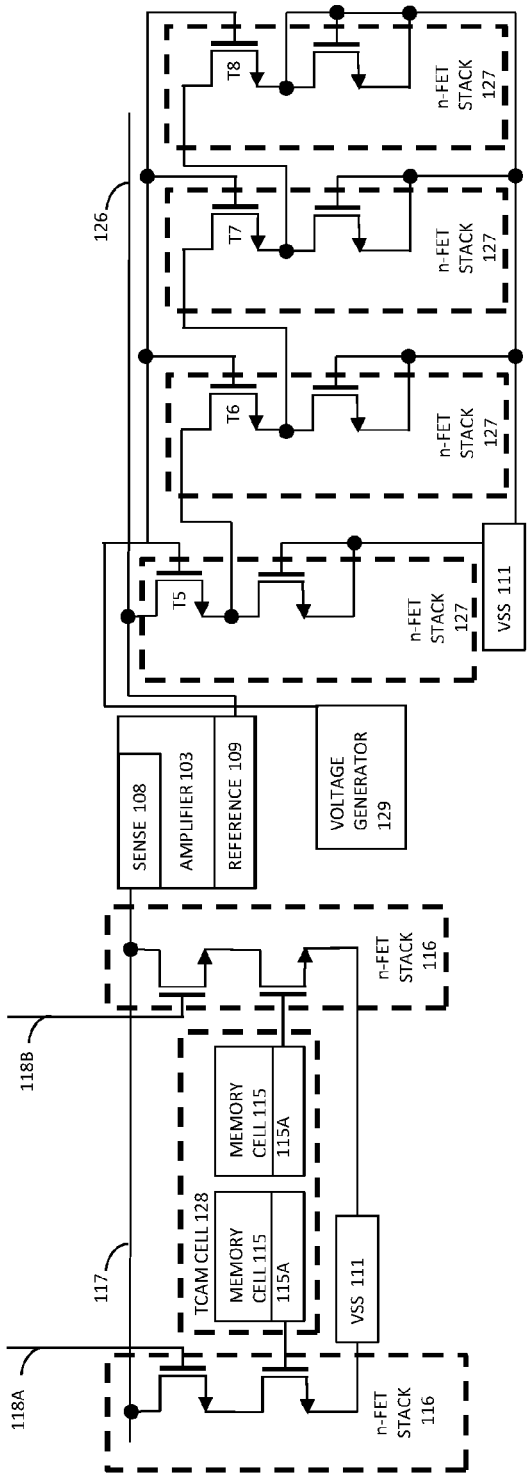
FIG. 7 depicts a circuit diagram of an electronic circuit comprising memory cells and a current sense amplifier.

FIGS. 7 and 8 depict another circuitry and its layout (135). The layout (135) is arranged in a similar way as the layout (134). The layout (135) provides for minimization of disparity of transistors (T5-8) used in the reference current source and transistors used in coupling circuits (n-FET stacks (116)). The circuitry depicted in FIG. 7 comprises ternary content addressable memory cells, TCAM, (128). Each of the TCAM cells comprises a pair of static memory cells (115). One memory cells of the pair is used for a storage of an information bit and another memory cell of the pair is used for a storage of a masking ("do not care") bit.

The masking bit is used for ignoring a value of the information bit, i.e. forcing a "match" response during evaluation of the TCAM cell in the phase 2 with independent of the value of the information bit. Each of the static memory cells (115) of the TCAM cell (128) has a respective first data output terminal (115A) being coupled to the sense current input terminal via a respective coupling circuit (n-FET stack (116)). The functioning and the configuration of the coupling circuits (n-FET stacks (116)) depicted in FIG. 7 is the same as the functioning and the configuration of the coupling circuits (n-FET stacks (116)) depicted in FIG. 4.

The reference current source comprises 4 transistors (T5-8) connected in series, wherein each of the transistors (T5-8) is comprised in a respective n-FET stack (127) of a second set (131) of the n-FET stacks. The gates of the transistors (T5-8) may be coupled to a voltage generator (129) for tuning of the reference current flowing through the transistors (T5-8). Alternatively the gates of the transistors (T5-8) may be coupled to the power terminal VDD (105) (not depicted in FIG. 7).

Transistors of the n-FET stacks (127) which are not used in the reference current source may be decoupled from the transistors (T5-8) used in the reference current source. Alternatively the transistors of the n-FET stacks (127) which are not used in the reference current source may have their gates and sources coupled to the ground terminal VSS (111). In this case these transistors are permanently closed and do not disturb operation of the reference current source.

The layout (135) corresponds to the circuitry depicted in FIG. 7. The memory cells (115) are arranged in a row and have their geometrical footprints adjacent to each other. The memory cells are splint in a first (132) and a second (133) set. A first set (132) of the memory cells (115) comprises pairs of memory cells being TCAM cells (128). Each of the memory cells of the first set has one associated coupling circuitry (n-FET stack (116)) of the first set (130) of the coupling circuitries. Each of the memory cells of the first set is coupled via the respective associated coupling circuitry of the first set to the sense current input terminal. A geometric footprint of each memory cell (115) of the first set (132) is adjacent to a geometric footprint of the respective coupling circuitry (n-FET stack (116)) of the first set (130). The memory cells (115) of the second set (132) are dummy memory cells. Their first data output terminals (115A) are not coupled to the sense current input terminal.

Each of the memory cells of the second set (133) has one associated coupling circuitry (n-FET stack (127)) of the second set (131) of the coupling circuitries. A geometric footprint of each memory cell (115) of the second set (133) is adjacent to a geometric footprint of the respective coupling circuitry (n-FET stack (127)) of the second set (131). Each of the coupling circuitries of the second set comprises at least one transistor of a set of serially coupled transistors used in the reference current source for coupling of the reference current terminal to the ground terminal. The coupling circuits of the first and the second set are arranged in a row and have their geometrical footprints adjacent to each other.

Figure 9:
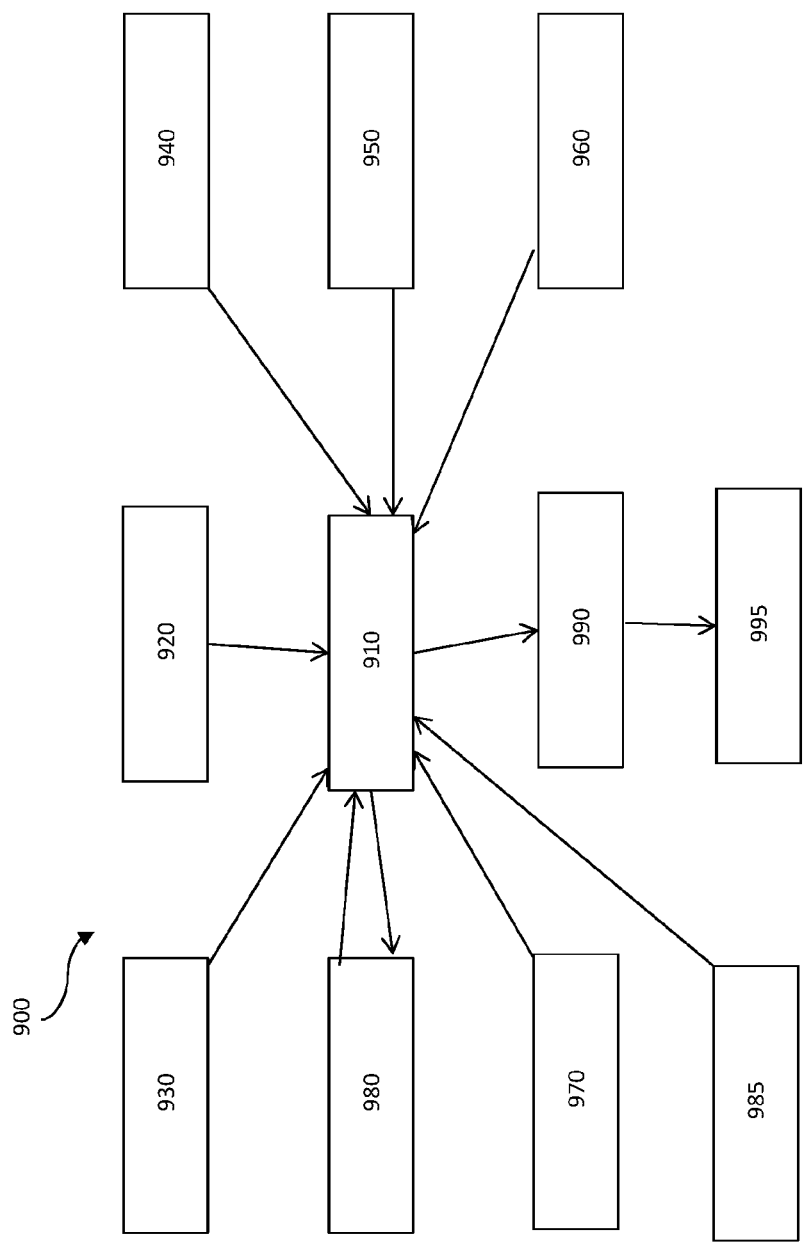
FIG. 9 depicts a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow (900) used for example, in semiconductor IC logic design, simulation, test, layout, and manufacture. Design flow (900) includes processes, machines and/or mechanisms for processing design structures or devices to generate logically or otherwise functionally equivalent representations of the design structures and/or devices described above and shown in FIGS. 1 and 4-8.

The design structures processed and/or generated by design flow (900) may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow (900) may vary depending on the type of representation being designed. For example, a design flow (900) for building an application specific IC (ASIC) may differ from a design flow (900) for designing a standard component or from a design flow (900) for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure (920) that is preferably processed by a design process (910). Design structure (920) may be a logical simulation design structure generated and processed by design process (910) to produce a logically equivalent functional representation of a hardware device. Design structure (920) may also or alternatively comprise data and/or program instructions that when processed by design process (910), generate a functional representation of the physical structure of a hardware device. Whether representing functional and/or structural design features, design structure (920) may be generated using electronic computer-aided design (ECAD) such as implemented by a core developer/designer.

When encoded on a machine-readable data transmission, gate array, or storage medium, design structure (920) may be accessed and processed by one or more hardware and/or software modules within design process (910) to simulate or otherwise functionally represent an electronic component, circuit, electronic or logic module, apparatus, device, or system such as this shown in FIGS. 1 and 4-8.

As such, design structure (920) may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process (910) preferably employs and incorporates hardware and/or software modules for synthesizing, translating, or otherwise processing a design/simulation functional equivalent of the components, circuits, devices, or logic structure shown in FIGS. 1 and 4-8 to generate a netlist (980) which may contain design structures such as design structure (920). Netlist (980) may comprise, for example, compiled or otherwise processed data structures representing a list of wires, discrete components, logic gates, control circuits, I/O devices, models, etc. that describes the connections to other elements and circuits in an integrated circuit design.

Netlist (980) may be synthesized using an iterative process in which netlist (980) is resynthesized one or more times depending on design specifications and parameters for the device. As with other design structure types described herein, netlist (980) may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process (910) may include hardware and software modules for processing a variety of input data structure types including netlist (980). Such data structure types may reside, for example, within library elements (930) and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications (940), characterization data (950), verification data (960), design rules (970), and test data files (985) which may include input test patterns, output test results, and other testing information. Design process (910) may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process (910) without deviating from the scope and spirit of the invention. Design process (910) may also include modules for performing standard circuit design processes such as timing analysis, verification, design rule checking, place and route operations, etc.

Design process (910) employs and incorporates logic and physical design tools such as HDL compilers and simulation model build tools to process design structure (920) together with some or all of the depicted supporting data structures along with any additional mechanical design or data (if applicable), to generate a second design structure (990).

Design structure (990) resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure (920), design structure (9900 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 4-8. In one embodiment, design structure (990) may comprise a compiled, executable HDL simulation model that functionally simulates the devices shown in FIGS. 1 and 4-8.

Design structure (990) may also employ a data format used for the exchange of layout data of integrated circuits and/or symbolic data format (e.g. information stored in a GDSII (GDS2), GL1, OASIS, map files, or any other suitable format for storing such design data structures). Design structure (990) may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 4-8. Design structure (990) may then proceed to a stage (995) where, for example, design structure (990): proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

We claim:

1. An electronic circuit comprising:
    a current sense amplifier, wherein the amplifier comprises a reference current input terminal, a sense current input terminal, and a first output terminal;
    a reference current source, wherein the reference current source comprises two reference n-FET stacks connected in series, and wherein the reference current input terminal is coupled to a ground terminal via the two reference n-FET stacks;
    a reference current generator to generate one or more reference currents, wherein the reference current generator is a voltage generator and coupled to a gate terminal of a transistor of each n-FET stack;
    the voltage generator configured to set a current flowing though the further two reference n-FET stacks being bigger than a maximum of a sum of a leakage currents of all first n-FET stacks and lower than a lowest of grounding currents with respect to the first n-FET stacks, wherein the grounding current of an individual first n-FET stack is given by the current that is flowing through the first n-FET stack when all of its transistors are open, and wherein the leakage current of an individual first n-FET stack is given by the current that is flowing through the first n-FET stack when at least one of its transistors is closed;
    a plurality of memory cells, wherein each memory cell is coupled in parallel via a respective sense n-FET stack to the sense current input terminal;
    wherein the amplifier is configured to:
        generate a first logical value at the first output terminal of the amplifier, in response to a sense current of the sense current input terminal being lower than a reference current of the reference current input terminal; and
        generate a second logical value at the first output terminal of the amplifier, in response to the sense current being higher than the reference current.

2. The electronic circuit of claim 1, wherein the amplifier further comprises:
    a control line input terminal;
    a first NAND gate having an output terminal, a first input terminal, and a second input terminal;
    a first inverter and a second inverter, the first and second inverters being cross coupled inverters, wherein the first inverter comprises a first p-FET and a first n-FET and the second inverter comprises a second p-FET and a second n-FET, wherein a source of the first n-FET is coupled to the sense current input terminal and a source of the second n-FET is coupled to the reference current input terminal, and wherein the sources of the first and second p-FETs are coupled to a power terminal; and
    a transmission gate comprising first and second transmission terminals and a gate terminal, wherein the first transmission terminal is coupled to an input terminal of the first inverter, the second transmission terminal is coupled to an input terminal of the second inverter, and the gate terminal is coupled to the control line terminal;
    wherein the output terminal of the first NAND gate is coupled to the first output terminal of the amplifier, and wherein the first input terminal of the first NAND gate is coupled to the control line input terminal.

3. The electronic circuit of claim 2, wherein the gate terminal of the transmission gate is configured for on/off switching of a coupling between the transmission terminals.

4. The electronic circuit of claim 2, further comprising a third inverter, wherein the first input terminal of the first NAND gate is coupled to the control line input terminal via the third inverter.

5. The electronic circuit of claim 4, further comprising:
    a second NAND gate comprising an output terminal, a first input terminal, and a second input terminal, wherein the output terminal of the second NAND gate is coupled to a second output terminal of the amplifier, and wherein the first input terminal of the second NAND gate is coupled to the control line input terminal via the third inverter and the second input terminal of the second NAND gate is coupled to an input terminal of the second inverter;
    wherein the input terminal of the first NAND gate is coupled to an input terminal of the first inverter; and wherein the current sense amplifier is further configured to:
    generate the second logical value at the second output terminal, in response to a reference current of the reference current input being higher than a sense current of the sense current input terminal, and
    generate the first logical value at the second output terminal, in response to a reference current of the reference current input terminal being lower than a sense current of the sense current input terminal.

6. The electronic circuit of claim 1, wherein each of the memory cells comprises a data output terminal for outputting data stored in the respective memory cell, wherein each of the data output terminals is coupled to a gate of one n-FET transistor of the respective sense n-FET stack.

7. The electronic circuit of claim 6, wherein each sense n-FET stack comprises at least one n-FET having a source coupled to a second ground terminal, a drain coupled to the sense current input terminal, and a gate coupled to a respective first output terminal of a memory cell.

8. The electronic circuit of claim 1, wherein each of the first output terminals of the memory cells generates a first voltage corresponding to the first logical value when the first logical value is stored in the memory cells, and wherein each of the first output terminals of the memory cells generates a second voltage corresponding to the second logical value when the second logical value is stored in the memory cells.

9. The electronic circuit of claim 1, wherein the reference n-FET stacks and the sense n-FET stacks are comprised in a set of reference n-FET stacks and a set of sense n-FET stacks, respectively.

10. A method comprising:
    comparing a sense current to a reference current;
    generating a first logical value in response to the sense current being lower than the reference current;
    generating a second logical value in response to the sense current being higher than the reference current; and
    generating one or more reference currents and setting an optimum reference current, wherein setting the optimum reference current comprises setting a current to be bigger than a maximum of a sum of leakage currents and smaller than a smallest of grounding currents, wherein a grounding current is a current flowing through a first reference n-FET stack of the amplifier when each transistor of the first reference n-FET stack is open, and wherein the leakage current is a current flowing through the first reference n-FET stack when at least one transistor of the first n-FET stack is closed.

11. The method of claim 10, further comprising:
    generating the second logical value in response to a reference current being higher than a sense current; and
    generating the first logical value at the second output terminal, in response to a reference current of the reference current input terminal being lower than a sense current of the sense current input terminal.

12. The method of claim 10, further comprising:
    in response to storing the first logical value, generating a first voltage corresponding to the first logical value; and
    in response to storing the second logical value, generating a second voltage corresponding to the second logical value.

13. A computer program product comprising a computer-readable storage medium having computer-readable program code embodied thereon, which when executed causes a computer to implement a method of:
    comparing a sense current to a reference current;
    generating a first logical value in response to the sense current being lower than the reference current;
    generating a second logical value in response to the sense current being higher than the reference current; and
    generating one or more reference currents and set an optimum reference current, wherein the optimum reference current comprises a current setting to be bigger than a maximum of a sum of leakage currents and smaller than a smallest of grounding currents, wherein a grounding current is a current flowing through a first reference n-FET stack of the amplifier when each transistor of the first reference n-FET stack is open, and wherein the leakage current is a current flowing through the first reference n-FET stack when at least one transistor of the first n-FET stack is closed.

14. The computer program product of claim 13, further comprising the computer to implement a method of:
    generating the second logical value in response to a reference current being higher than a sense current; and
    generating the first logical value at the second output terminal, in response to a reference current of the reference current input terminal being lower than a sense current of the sense current input terminal.

15. The computer program product of claim 13, further comprising the computer to implement a method of:
    in response to storing the first logical value, generating a first voltage corresponding to the first logical value; and
    in response to storing the second logical value, generating a second voltage corresponding to the second logical value.

\* \* \* \* \*